United States Patent
Tamura

(10) Patent No.: US 6,710,393 B2
(45) Date of Patent: Mar. 23, 2004

(54) FAILURE-ANALYZING SEMICONDUCTOR DEVICE AND SEMICONDUCTOR DEVICE MANUFACTURING METHOD USING THE SAME

(75) Inventor: Itaru Tamura, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 200 days.

(21) Appl. No.: 09/749,809

(22) Filed: Dec. 28, 2000

(65) Prior Publication Data

US 2001/0005329 A1 Jun. 28, 2001

(30) Foreign Application Priority Data

Dec. 28, 1999 (JP) ............................................ 11-375474

(51) Int. Cl.$^7$ ................................................. H01L 29/76
(52) U.S. Cl. ........................................ 257/307; 257/313
(58) Field of Search .............................. 257/307, 313; 438/399; 365/154, 205, 63

(56) References Cited

U.S. PATENT DOCUMENTS 4,012,757 A * 3/1977 Koo .............................. 257/313
4,992,981 A * 2/1991 Ganssloser et al. ......... 365/154

FOREIGN PATENT DOCUMENTS

| EP | 0 840 325 A2 | * 6/1998 | ............ G11C/7/06 |
|----|--------------|----------|----------------------|
| JP | 63-269542 | 11/1988 | |
| JP | 5-121696 | 5/1993 | |
| JP | 5-144917 | 6/1993 | |
| JP | 5-282898 | 10/1993 | |
| JP | 9-134940 | 5/1997 | |
| JP | 9-213762 | 8/1997 | |
| JP | 9-306965 | 11/1997 | |
| JP | 2000-012633 | 1/2000 | |

* cited by examiner

Primary Examiner—Richard Elms
Assistant Examiner—Doug Menz
(74) Attorney, Agent, or Firm—Oblon, Spivak, McClelland, Maier & Neustadt, P.C.

(57) ABSTRACT

A failure analyzing method using a failure-analyzing semiconductor device includes a first step of manufacturing a semiconductor device adapted for product in predetermined numbers during a first interval and a second step of manufacturing a failure-analyzing semiconductor device in predetermined numbers every second interval during the first interval. The first step includes a step of forming memory cells in a first semiconductor substrate. The second step includes a step of forming memory cells in a second semiconductor substrate and a step of forming first and second digitated interconnections at the same level above the second semiconductor substrate, which are connected to the memory cells and arranged so that the fingers of each of the first and second interconnections are interleaved with those of the other with a predetermined space therebetween.

14 Claims, 6 Drawing Sheets

MEMORY CELL (1BIT)  MEMORY CELL (1BIT)
ROW DIRECTION

MEMORY CELL (1BIT)  MEMORY CELL (1BIT)
ROW DIRECTION

ROW DIRECTION

■ ---- DEFECTIVE BITS

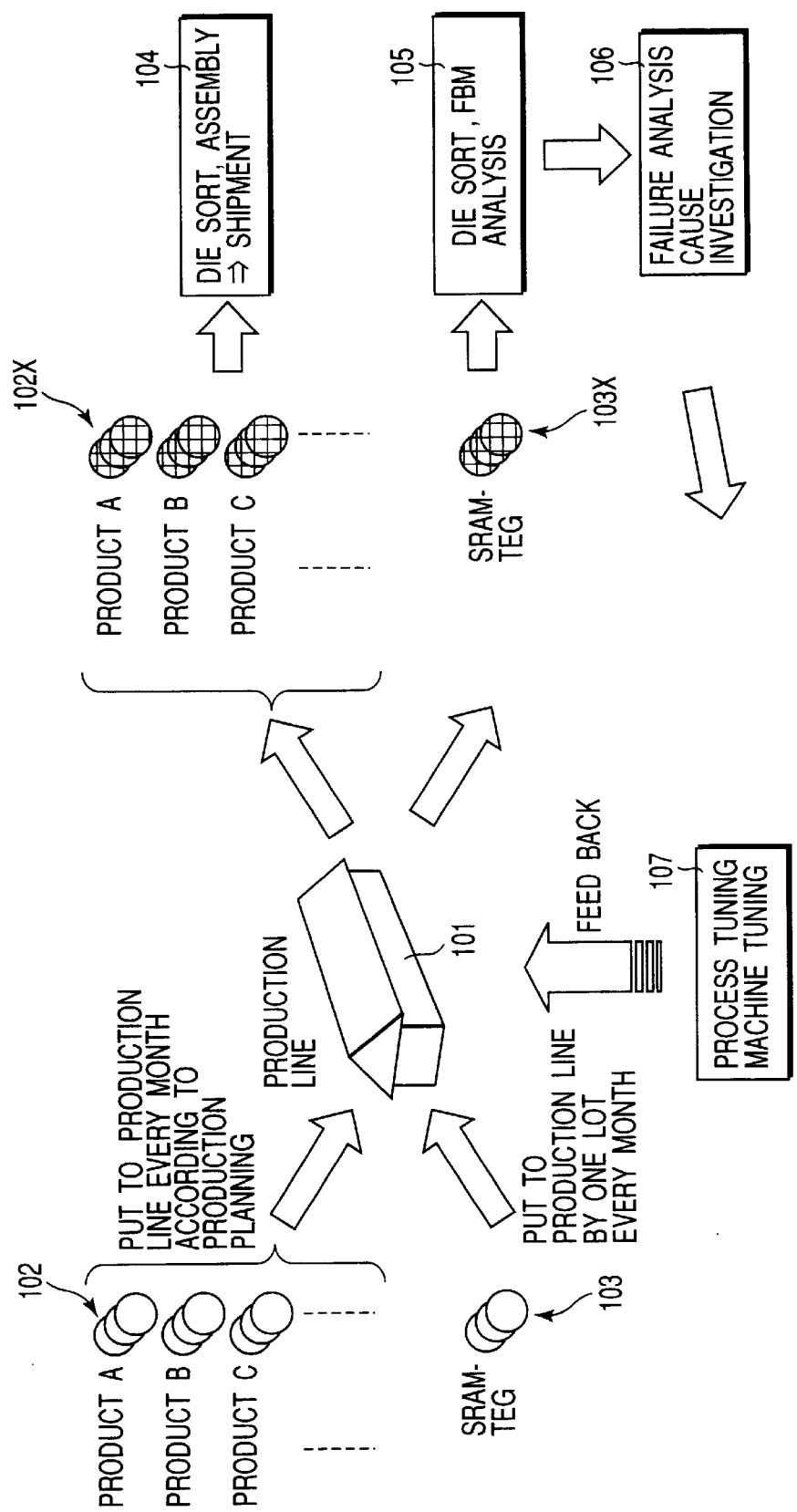
F I G. 5

MEMORY CELL (1BIT)  MEMORY CELL (1BIT)
ROW DIRECTION

■ ---- DEFECTIVE BITS

FAILURE-ANALYZING SEMICONDUCTOR DEVICE AND SEMICONDUCTOR DEVICE MANUFACTURING METHOD USING THE SAME

CROSS-REFERENCE TO RELATED APPLICATIONS

This application is based upon and claims the benefit of priority from the prior Japanese Patent Application No. 11-375474, filed Dec. 28, 1999, the entire contents of which are incorporated herein by reference.

BACKGROUND OF THE INVENTION

1. Field of the Invention

The present invention relates to a failure-analyzing semiconductor device having memory cells and a method of manufacturing a semiconductor device using the failure-analyzing semiconductor device. More specifically, the present invention relates to a failure-analyzing semiconductor device adapted to monitor the process, yield and reliability in a factory on a regular basis and a method of manufacturing a semiconductor device using the failure-analyzing semiconductor device.

2. Description of the Related Art

Conventionally, in a production line for semiconductor devices, failure-analyzing LSIs (large-scale integrated circuits) have been produced on a regular basis in addition to LSI products for sale. These LSIs are used to improve the yield in the semiconductor device production line or to test the reliability on behalf of products.

For example, in the manufacture of SRAMs (static random access memories), failure-analyzing LSIs (hereinafter referred to as SRAM-TEG (test element group)) each having an SRAM cell array and a test pattern formed have been used.

With the use of the SRAM-TEG, when failures have occurred, a memory test can be made to identify defective cells. Also, the SRAM-TEG, being simple in structure, allows ease of identification of defective regions and analysis of causes. The introduction of an FBM (fail bit map) system has made the identification and analysis of defective cells and regions still easier.

The FBM is a system which represents memory cells in rows and columns according to their physical arrangement and displays defective cells and non-defective cells. In the FBM, defective cells are divided into a number of failure categories according to their arrangement. The failure categories are patterns of arrangement of defective bits (defective cells) detected by the FRB system. The failure categories vary according to interconnection structures of SRAMs.

A conventional failure-analyzing LSI will be described with some accompanying drawings.

FIG. 1A is a plan view of interconnection patterns of the conventional failure-analyzing LSI. FIG. 1B schematically shows, in a sectional view, the structure of the failure-analyzing LSI.

As shown in FIG. 1B, a semiconductor substrate 51 has diffused regions (active regions) 52 formed therein. On the opposite sides of each diffused region are formed two memory cells (not shown). Memory cells corresponding to eight bits are formed for four diffused regions 52.

Over the semiconductor substrate 51 are formed sequentially first-level interconnect patterns (not shown) and a second-level interconnect patterns (in the drawing, a bit line pattern 53A is shown) with an insulating film interposed therebetween. The bit line pattern 53A is connected to the diffused regions 52 through via holes 54. FIG. 1B is a sectional view of the bit line pattern 53A of the failure-analyzing LSI along the column direction.

As the second-level interconnect patterns, as shown in FIG. 1A, /bit line patterns 53B and reference-potential line patterns 53C are formed in addition to the bit line patterns 53A. The bit line patterns 53A and the /bit line patterns 53B are interconnections which are supplied with different potentials each of which is the inverse of the other. The bit line patterns 53A and the /bit line patterns 53B are supplied with a write signal or read signal in a read operation or write operation. The reference potential line patterns 53C are supplied with a reference potential.

In such a failure-analyzing LSI, failures which occur in the bit line patterns 53A, the /bit line patterns 53B and the reference potential line patterns 53C are detected by the FBM. For example, in the event of a short circuit between each pattern, the FBM becomes as depicted in FIG. 2.

Next, another conventional failure-analyzing LSI will be described.

FIG. 3A is a plan view of interconnection patterns of the conventional failure-analyzing LSI. FIG. 3B schematically shows, in a sectional view, the structure of the failure-analyzing LSI.

As shown in FIG. 3B, as in the aforementioned failure-analyzing LSI, the semiconductor substrate 51 has diffused regions (active regions) 52 formed therein. Memory cells corresponding to eight bits are formed for four diffused regions 52.

Over the semiconductor substrate 51 are formed sequentially first-level interconnect patterns (not shown), second-level interconnect patterns (in the drawing, the bit line pattern 53A is shown) and third-level interconnect patterns (in the drawing, a bit line pattern 55A is shown) with an insulating film interposed between each interconnect pattern. The bit line pattern 53A is connected to the diffused regions 52 through via holes 56. The bit line pattern 55A is connected to the bit line pattern 53A through via holes 57.

FIG. 3A shows only the second- and third-level interconnect patterns. As the second-level interconnect patterns, /bit line patterns 53B and reference-potential line patterns 53C are formed in addition to the bit line patterns 53A. As the third-level interconnect patterns, /bit line patterns 55B are formed in addition to the bit line patterns 55A.

The bit line patterns 53A and the /bit line patterns 53B are interconnections which are supplied with different potentials each of which is the inverse of the other. The bit line patterns 53A and the /bit line patterns 53B are supplied with a write signal or read signal in a read operation or write operation. The reference potential line patterns 53C are supplied with a reference potential. Likewise, the bit line patterns 55A and the /bit line patterns 55B are interconnections which are supplied with different potentials each of which is the inverse of the other. The bit line patterns 55A and the /bit line patterns 55B are supplied with a write signal or read signal in a read operation or write operation. The reference potential line patterns 53C are supplied with a reference potential.

In such a failure-analyzing LSI, failures which occur in the second-level line patterns 53A, 53B and 53C and the third-level line patterns 55A and 55B are detected by the FBM. For example, in the event of a short circuit between the second-level line patterns or the third-level line patters, the FBM will show the same failure category as depicted in FIG. 2.

However, the failure-analyzing LSI shown in FIG. 1B has a problem that since the density of interconnections, such as the bit line patterns 53A, the /bit line patterns 53B and the reference potential line patterns 53C, in the memory cell array is low and there is little minimum space between each interconnection, the rate of detection of a short circuit between each interconnection is low.

In the failure-analyzing LSI shown in FIG. 3B, the failure category detected by the FBM in the event that the second-level bit line patterns 53A and 53B are short-circuited is the same as in the event that the third-level bit line patterns 55A and 55B are short-circuited. For this reason, a layer in which a failure has occurred cannot be identified. That is, even with different defective regions or different causes of failure, the FBM indicates the same failure category, making it difficult to identify defective regions or causes of failure. Therefore, physical analysis of defective regions is required.

In LSIs, multilevel interconnections have been increasingly used. In failure-analyzing LSIs (SRAM-TEG and the like) as well, multilevel interconnections are being adopted accordingly. This results in an increase in the probability of different defective regions or different causes of failure being indicated as the same failure category.

BRIEF SUMMARY OF THE INVENTION

It is an object of the present invention to provide a semiconductor device which saves the necessity of physical analysis of defective regions and allows the time required for failure analysis to be reduced and the rate of failure detection to be improved.

It is another object of the present invention to provide a method of manufacturing a semiconductor device using a failure-analyzing semiconductor device which allows failures which occur in semiconductor devices to be reduced.

According to a first aspect of the present invention, there is provided a failure-analyzing semiconductor device comprising: a semiconductor substrate formed with memory cells for storing information; a first digitated interconnection formed above the semiconductor substrate and connected to the memory cells; and a second digitated interconnection formed above the semiconductor substrate and connected to the memory cells, the second digitated interconnection being formed at the same level as the first digitated interconnection with a predetermined space therebetween.

According to a second aspect of the present invention, there is provided a failure-analyzing semiconductor device comprising: a semiconductor substrate formed with memory cells for storing information; a first interconnection formed above the semiconductor substrate and connected to the memory cells; a second interconnection formed above the semiconductor substrate and connected to the memory cells, the second interconnection being formed at the same level as the first interconnection with a predetermined space therebetween; a third interconnection formed above the first interconnection and connected to the memory cells, the third interconnection being formed adjacent to the second interconnection; and a fourth interconnection formed at the same level as the third interconnection with a predetermined space therebetween and connected to the memory cells.

According to a third aspect of the present invention, there is provided a semiconductor device comprising: a first semiconductor substrate formed with memory cells for storing information and adapted for a product; a second semiconductor substrate formed with memory cells and adapted for failure analysis, the second semiconductor substrate having first and second digitated interconnections formed at the same level above the second semiconductor substrate and connected to the memory cells in the second semiconductor substrate, the first and second interconnections being arranged so that the fingers of each interconnection being interleaved with those of the other with a predetermined space therebetween.

According to a fourth aspect of the present invention, there is provided a semiconductor device comprising: a first semiconductor substrate formed with memory cells for storing information and adapted for a product; a second semiconductor substrate formed with memory cells and adapted for failure analysis, the second semiconductor substrate having a first interconnection formed above the second semiconductor substrate and connected to the memory cells; a second interconnection formed at the same level as the first interconnection with a predetermined space therebetween and connected to the memory cells; a third interconnection formed above the first interconnection and connected to the memory cells, the third interconnection being formed adjacent to the second interconnection; and a fourth interconnection formed at the same level as the third interconnection with a predetermined space therebetween and connected to the memory cells.

According to a fifth embodiment of the present invention, there is provided a semiconductor device manufacturing method using a failure-analyzing semiconductor device comprising: a first circuit formation step of forming a first electronic circuit on a first wafer using a production line; a first wafer processing step of processing the first wafer having the first electronic circuit formed in the first circuit formation step so that it can be shipped; a second circuit formation step of forming a testing electronic circuit on a testing wafer using the production line; a failure analyzing step of making failure analysis using the testing electronic circuit formed on the testing wafer; a tuning step of tuning the production line on the basis of the analyses in the failure analyzing step; a third circuit formation step of forming a second electronic circuit having at least a circuit diagram identical to that of the first electronic circuit on a second wafer using the production line subjected to tuning; and a second wafer processing step of processing the second wafer having the second electronic circuit formed in the third circuit formation step so that it can be shipped.

In the semiconductor device according to each of the first to fourth aspects, the minimum space portion is formed between the first and second interconnections or the third and fourth interconnections. The first and second interconnections or the third and fourth interconnections are formed so that the minimum space portion therebetween is increases. Thereby, the rate of detecting failure which may occur between the interconnections can be improved and the time required for failure analysis can be reduced.

In the semiconductor device manufacturing method using a failure-analyzing semiconductor device according to the fifth aspect of the present invention, failure analysis is made using a testing electronic circuit formed on a testing wafer and the production line is tuned on the basis of the analyzes of failure. Thereby, failures in semiconductor devices formed in the second wafer can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a diagram for use in explanation of product LSIs and failure-analyzing LSIs put to manufacture on production line and utilization of finished LSIs in accordance with the present invention;

DETAILED DESCRIPTION OF THE INVENTION

[First Embodiment]

In a production line for semiconductor devices, failure-analyzing LSIs (large-scale integrated circuits) are put to manufacture process on a regular basis in addition to LSIs for sale. These failure-analyzing LSIs are used to improve the yield in the semiconductor device production line or to test the reliability on behalf of LSI products.

For example, in the production line for SRAMs (static random access memories), failure-analyzing LSIs each having an SRAM cell array and a test pattern formed are manufactured and used to analyze failures and investigate causes of the failures.

FIG. 5 is a diagram for use in explanation of product LSIs and failure-analyzing LSIs put to manufacture on production line and utilization of finished LSIs.

As shown, products A, B and C (102) are each put to semiconductor device production line 101 and manufactured every month by a predetermined number of lots in accordance with production planning. Failure-analyzing LSIs (SRAM-TEG) 103 are each put and manufactured regularly in the intervals of the products A, B and C by a predetermined number of lots (say, one lot every month). The finished products A, B and C (102X) are each cut into individual chips, which in turn are assembled and shipped (104).

The finished failure-analyzing LSIs (103X) are subjected to die sort and FBM analysis (105). The failure-analyzing LSI is then subjected to failure analysis and undergoes investigations into the cause of the failure (106). On the basis of the results of the failure analysis and investigations of the failure, process tuning and machine tuning are carried out (107). In the process tuning, the manufacturing conditions, such as RIE conditions, are reconsidered. In the machine tuning, periodical renewal parts used in manufacturing apparatuses are inspected and renewed.

Hereinafter, embodiments of the failure-analyzing LSI will be described in detail with reference to the accompanying drawings.

In the first embodiment, patterns are formed such that interconnections which are formed at the same level over a semiconductor substrate of a failure-analyzing LSI which are supplied with different potentials are close to each other over a long distance. This allows minimum space between the interconnections to be increased. Here, second-level interconnections formed over the semiconductor substrate will be described by way of example.

Figure 1A:
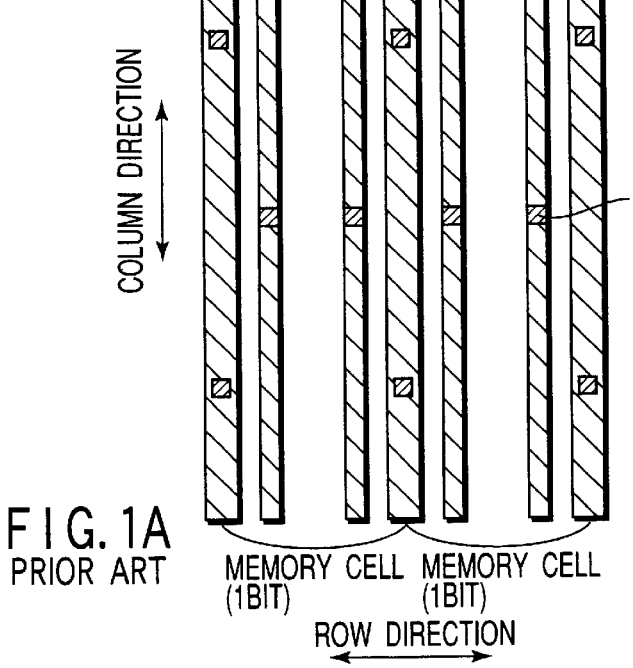
FIG. 1A is a plan view of interconnect patterns of a conventional failure-analyzing LSI.
Figure 1B:
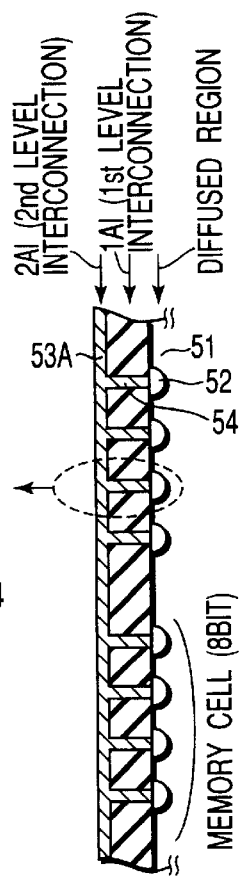
FIG. 1B is a schematic sectional view of the LSI of FIG. 1A.
Figure 2:
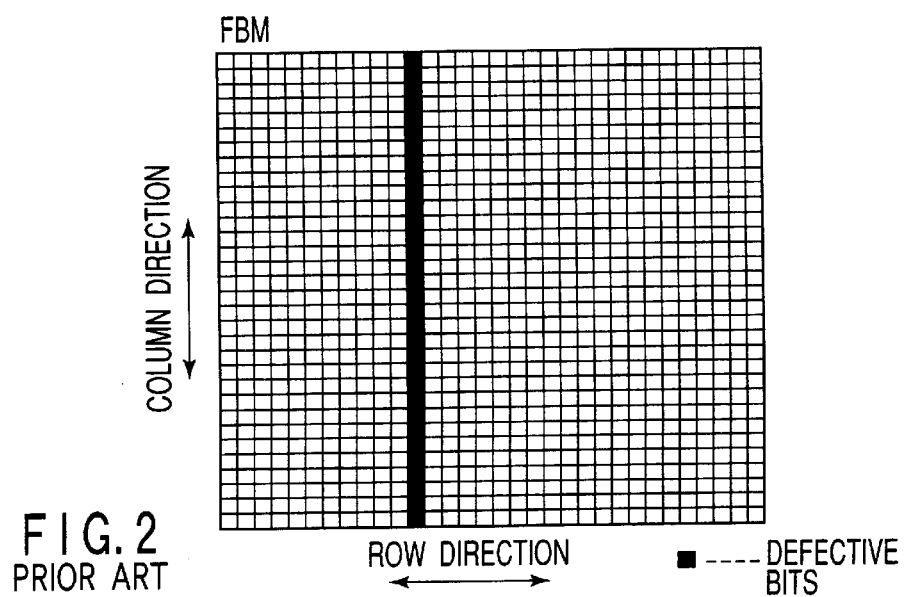
FIG. 2 shows an FRB indication in the event that a short circuit has occurred between patterns in the LSI of FIGS. 1A and 1B.
Figure 3A:
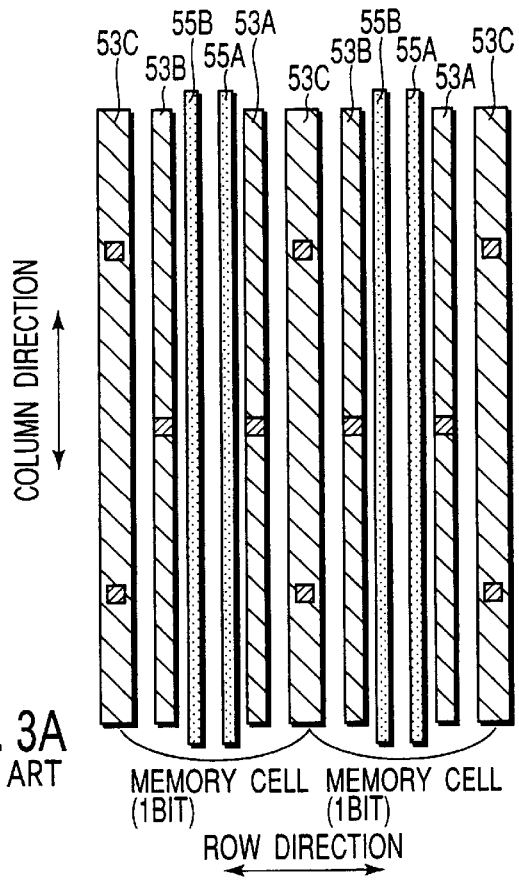
FIG. 3A is a plan view of interconnect patterns of another conventional failure-analyzing LSI.
Figure 3B:
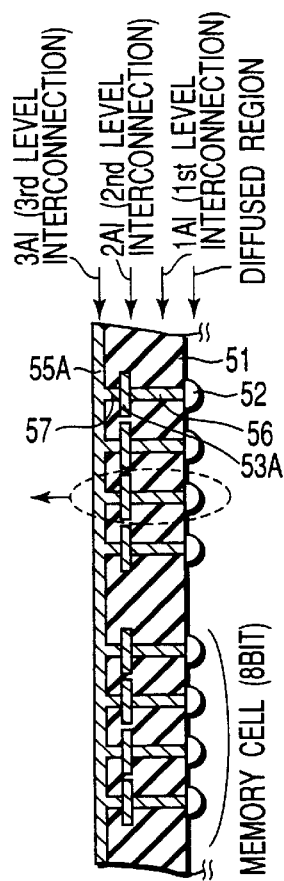
FIG. 3B is a schematic sectional view of the LSI of FIG. 3A.
Figure 4:
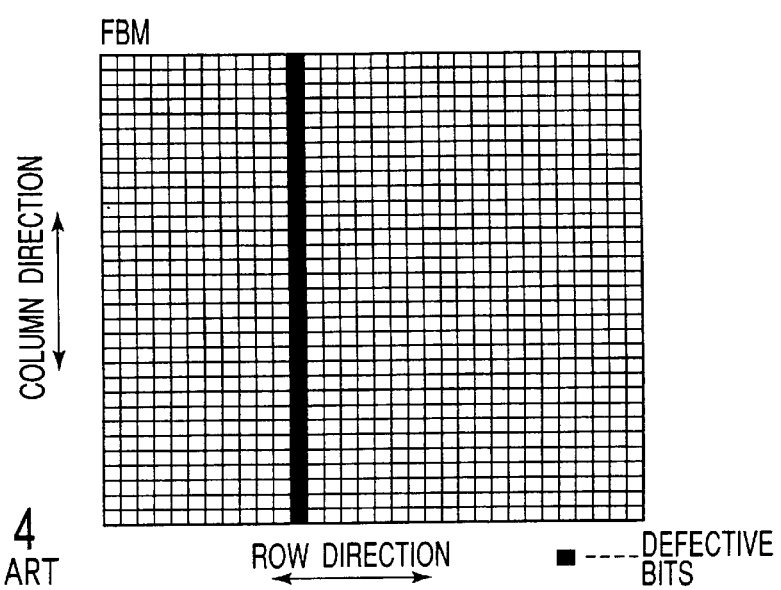
FIG. 4 shows an FRB indication in the event that patterns have been short-circuited in the LSI of FIGS. 3A and 3B.
Figure 6A:
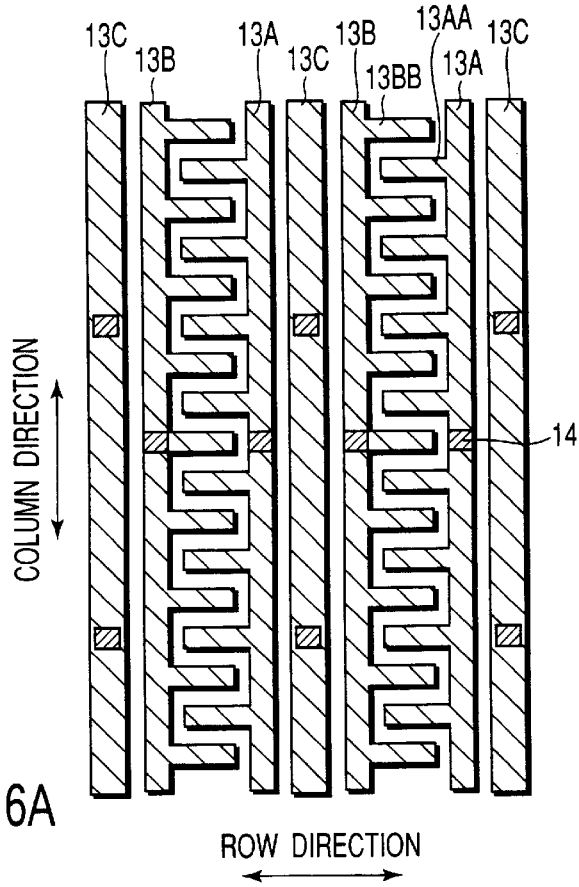
FIG. 6A is a plan view of interconnect patterns of a semiconductor device according to a first embodiment of the present invention.
Figure 6B:
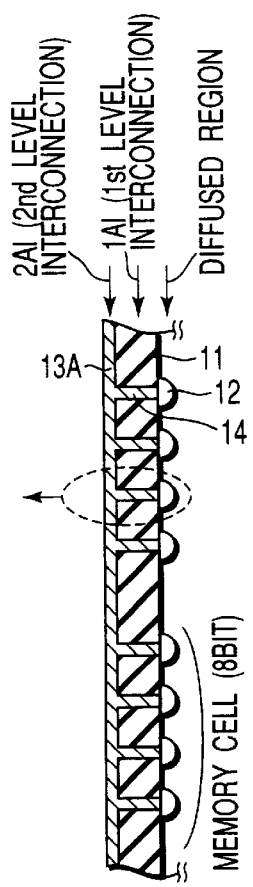
FIG. 6B is a schematic sectional view of the semiconductor device of the first embodiment.

FIG. 6A is a plan view of interconnect patterns of a semiconductor device according to the first embodiment of the present invention. FIG. 6B is a schematic sectional view of the semiconductor device of the first embodiment.

As shown in FIG. 6B, a semiconductor substrate 11 is formed with diffused regions (active regions) 12. On the opposite sides of each diffused region are formed two memory cells (not shown). Memory cells corresponding to eight bits are formed for four diffused regions 12. Over the semiconductor substrate 11 are formed sequentially first-level interconnect patterns (not shown) and second-level interconnect patterns (in the drawing, a bit line pattern 13A is shown) with an insulating film interposed therebetween. The bit line pattern 13A is connected to the diffused regions 12 through via holes 14. FIG. 6B is a sectional view of the bit line pattern 13A of the failure-analyzing LSI along the column direction.

As the second-level interconnect patterns, as shown in FIG. 6A, /bit line patterns 13B and reference-potential line patterns 13C are formed in addition to the bit line patterns 13A. The bit line patterns 13A and the /bit line patterns 13B are interconnections which are supplied with different potentials each of which is the inverse of the other. The bit line patterns 13A and the /bit line patterns 13B are supplied with a write signal or read signal in a read operation or write operation. The reference potential line patterns 13C are supplied with a reference potential.

As shown in FIG. 6A, the bit line pattern 13A is formed with a number of fingers 13AA and the /bit line pattern 13B is formed with a number of fingers 13BB. The fingers 13AA are interleaved with the fingers 13BB along the column direction so that minimum space is ensured between the patterns.

In other words, each finger 13BB of the /bit line pattern 13B is interposed between two adjacent fingers 13AA of the bit line pattern 13A and each finger 13AA of the /bit line pattern 13A is interposed between two adjacent fingers 13BB of the /bit line pattern 13B. Predetermined space is ensured between the digitated bit line patterns 13A and 13B.

Thus, in the first embodiment, additional interconnect patterns (fingers 13AA and 13BB) are formed between interconnections supplied with different potentials (the bit line patterns 13A and 13B) to increase the minimum space portions between them. Thereby, the minimum space portions for each pair of bit line patterns 13A and 13B can be increased, allowing the sensitivity of detecting a short-circuit between the line patterns to be enhanced.

Figure 7:
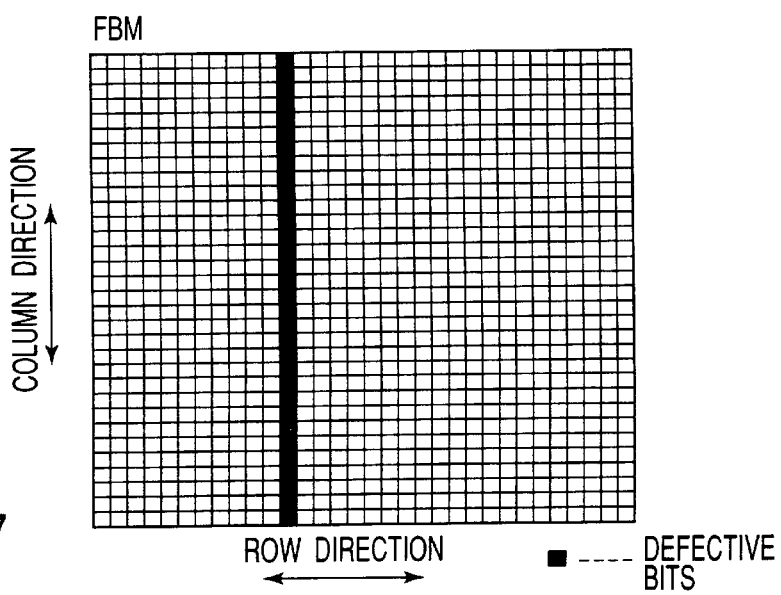
FIG. 7 shows an FMB indication in the event that a short circuit has occurred between patterns in the semiconductor device of the first embodiment.

In the failure-analyzing LSI, failures which occur in the bit line patterns 13A and 13B and the reference potential line patterns 13C are sensed by means of FBM. For example, in the event that a short has occurred between the second-level patterns, the FBM becomes as depicted in FIG. 7. The failure category in this case remains unchanged from that in the prior art.

According to the first embodiment, as described above, by providing additional interconnections so as to increase minimum space spots between interconnections supplied with different potentials, the rate of sensing a short circuit between the interconnections can be improved.

By improving the short-circuit sensing rate, a sign of failure can be detected in the SRAM-TEG 103X before failures occur in the products A, B and C shown in FIG. 5. On the basis of the result of the detection, the production line 101 for the products A, B an C is tuned up. Therefore, it becomes possible to avoid the occurrence of failures in the products A, B and C in advance.

[Second Embodiment]

In a second embodiment of the present invention, a plurality of interconnection layers are formed over the semiconductor substrate of a failure-analyzing LSI. The second-level interconnections formed over the semiconductor substrate and the third-level interconnections formed above the second-level interconnections will be described herein. In the second embodiment, of bit lines assigned addresses, the bit lines assigned odd addresses are formed as the second-level interconnections and the bit lines assigned even addresses are formed as the third-level interconnections.

Figures 8A, 8B, 8C:
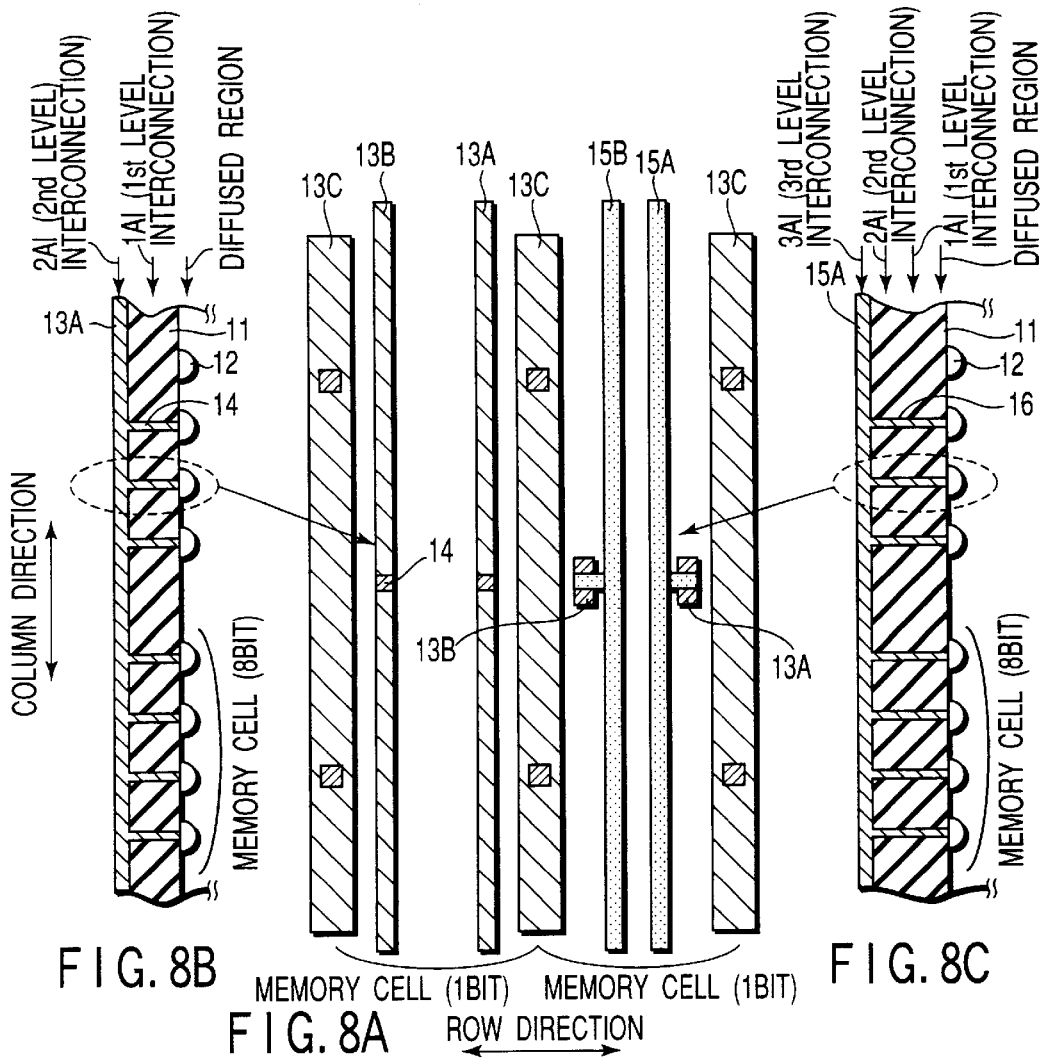
FIG. 8A is a plan view of second- and third-level interconnect patterns of a semiconductor device according to a second embodiment of the present invention.
FIGS. 8B and 8C are schematic sectional views of the semiconductor device of the second embodiment.

FIG. 8A is a plan view of second- and third-level interconnect patterns of a semiconductor device according to the second embodiment of the present invention. FIGS. 8B and 8C are schematic sectional views of the semiconductor device of the second embodiment.

As shown, a semiconductor substrate 11 is formed with diffused regions (active regions) 12. On the opposite sides of each diffused region are formed two memory cells (not shown). Memory cells corresponding to eight bits are formed for four diffused regions 12.

Over the semiconductor substrate 11 are formed sequentially first-level interconnect patterns (not shown), second-level interconnect patterns (in the drawing, a bit line pattern 13A is shown) and third-level interconnect patterns (in the drawing, a bit line pattern 15A is shown) with an insulating film interposed therebetween. The bit line pattern 13A is connected to the diffused regions 12 through via holes 14. The bit line pattern 15A is connected to the diffused regions 12 through via holes 14. The bit line pattern 13A is connected to the diffused regions 12 through via holes 14. FIG. 8B is a sectional view of the bit line pattern 13A of the failure-analyzing LSI along the column direction. FIG. 8C is a sectional view of the bit line pattern 15A of the failure-analyzing LSI along the column direction.

FIG. 8A shows the second- and third-level interconnect patterns alone. As the second-level interconnect patterns, as shown in FIG. 8A, /bit line pattern 13B and reference-potential line pattern 13C are formed in addition to the bit line pattern 13A. As the third-level interconnect patterns, bit line pattern 15A and /bit line pattern 15B are formed.

The bit line pattern 13A and the /bit line pattern 13B are interconnections which are supplied with different potentials each of which is the inverse of the other. The bit line pattern 13A and the /bit line pattern 13B are supplied with a write signal or read signal in a read operation or write operation. Likewise, the bit line pattern 15A and the /bit line pattern 15B are interconnections which are supplied with different potentials each of which is the inverse of the other. The bit line pattern 15A and the /bit line pattern 15B are supplied with a write or read signal in a read operation or write operation. The reference potential line patterns 13C are supplied with a reference potential.

The bit line patterns 13A, 13B, 15A and 15B are assigned addresses. Each pair of second-level bit lines (13A and 13B) is assigned an odd address. Each pair of third-level bit lines (15A and 15B) is assigned an even address.

Figure 9:
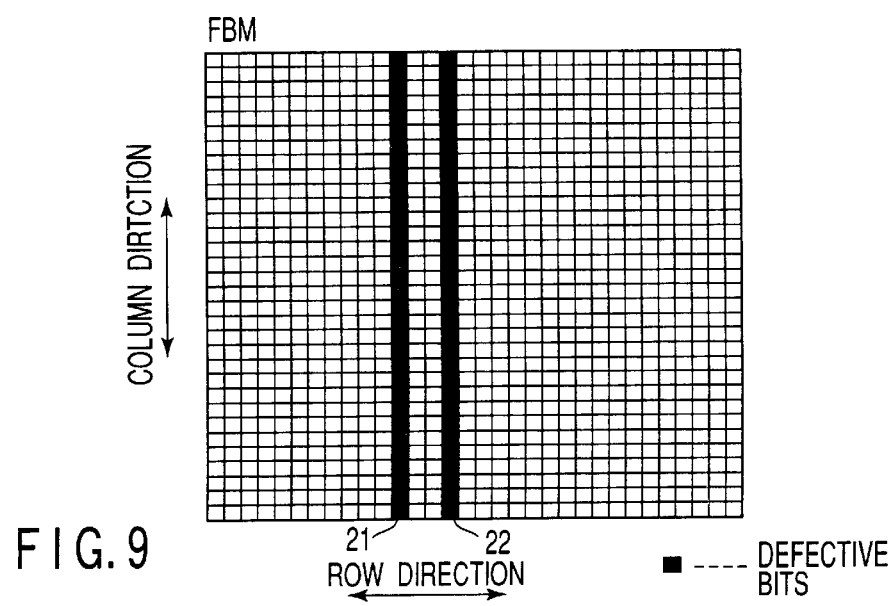
FIG. 9 shows an FMB indication in the event of a short circuit between patterns in the semiconductor device of the second embodiment.

The detection of a failure which may occur in the second-level or third level interconnect patterns by the FBM will be described. For example, in the event of a short-circuit failure between second-level interconnect patterns, a column line 21 corresponding to an odd address is indicated as a defective bit in the FBM as shown in FIG. 9. On the other hand, in the event that a short circuit has occurred between third-level interconnect patterns, a column line 22 corresponding to an even address is indicated as a defective bit in the FBM. Thus, a layer in which a failure has occurred can be identified by an address indication in the FMB, that is, whether the failure category indicated in the FMB is an odd or even address.

Moreover, according to the second embodiment, a layer or region of the SRAM-TEG 103X in which a failure has occurred can be detected readily before failures occur in the products A, B and C shown in FIG. 5. The production line 101 for the products A, B and C is tuned up in accordance with the results of failure detection in the SRAM-TEG, thereby allowing the occurrences of failures in the products A, B and C to be avoided in advance.

[Third Embodiment]

Next, a third embodiment of the present invention will be described which is a combination of the first and second embodiments. As with the second embodiment, the third embodiment has a number of interconnect layers formed over the semiconductor substrate of a failure-analyzing LSI. The second-level interconnections formed over the semiconductor substrate and the third-level interconnections formed above the second-level interconnections will be described herein.

Figures 10A, 10B, 10C:
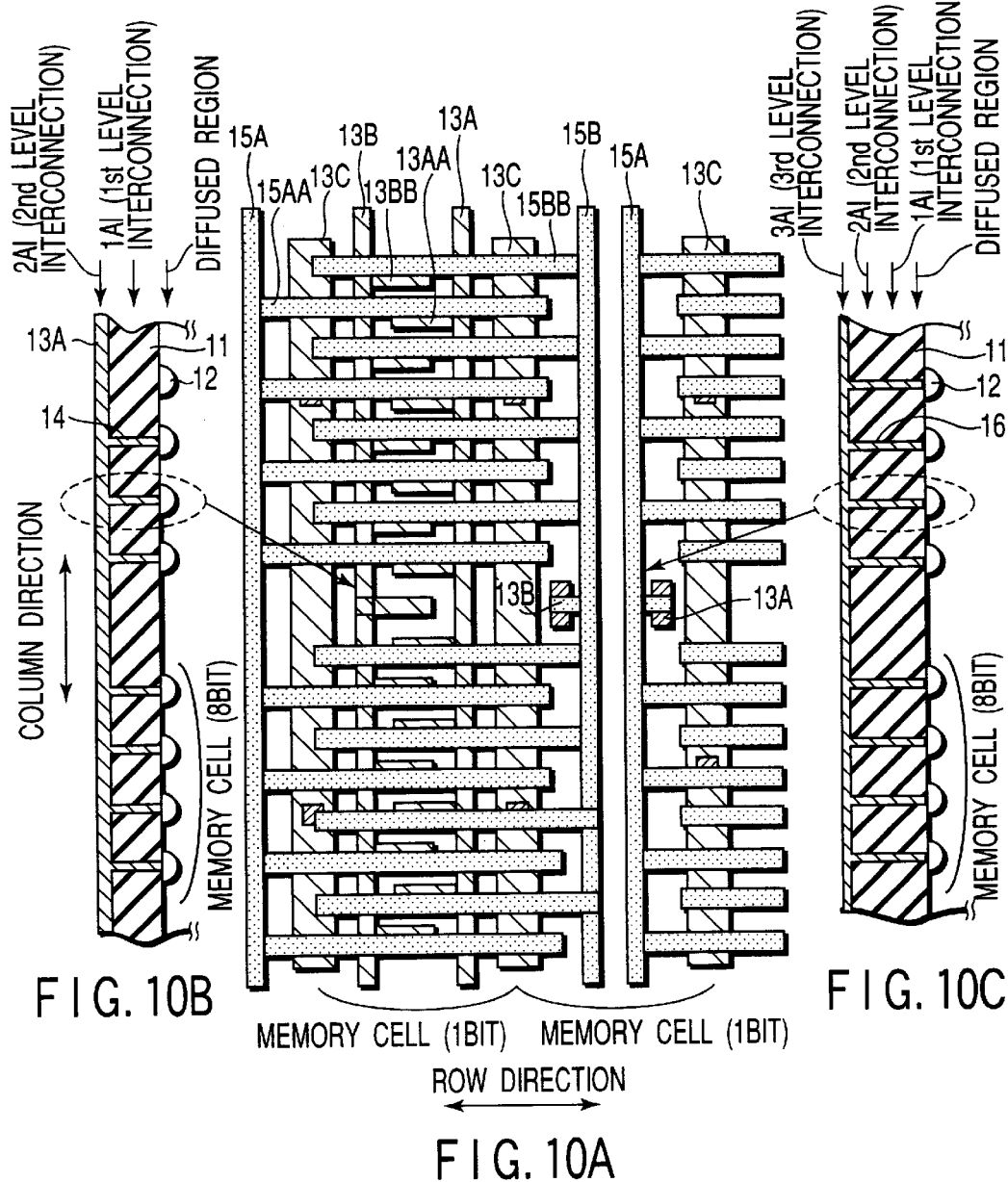
FIG. 10A is a plan view of second- and third-level interconnect patterns of a semiconductor device according to a third embodiment of the present invention.
FIGS. 10B and 10C are schematic sectional views of the semiconductor device of the third embodiment.

FIG. 10A is a plan view of second- and third-level interconnect patterns of a semiconductor device according to the third embodiment of the present invention. FIGS. 10B and 10C are schematic sectional views of the semiconductor device of the third embodiment.

The detailed description of corresponding parts in the third embodiment to those in the first and second embodiments is omitted and only the point of the third embodiment will be described hereinafter.

As shown in FIG. 10A, the bit line pattern 13A is formed with a number of fingers 13AA and the /bit line pattern 13B is formed with a number of fingers 13BB. The fingers 13AA are interleaved with the fingers 13BB along the column direction so that minimum space is ensured between the patterns.

Likewise, the bit line pattern 15A is formed with a number of fingers 15AA and the /bit line pattern 15B is formed with a number of fingers 15BB. The fingers 15AA are interleaved with the fingers 15BB along the column direction so that minimum space is ensured between the patterns.

Thus, additional interconnect patterns (fingers 13AA and 13BB) are formed between the second-level interconnections supplied with different potentials (the bit line patterns 13A and 13B) to increase the minimum space portions between them. This allows the sensitivity of detecting a short-circuit between the second-level line patterns to be enhanced. Likewise, additional interconnect patterns (fingers 15AA and 15BB) are formed between the third-level interconnections supplied with different potentials (the bit line patterns 15A and 15B) to increase the minimum space portions between them. This allows the sensitivity of detecting a short-circuit between the third-level line patterns to be enhanced.

The bit line patterns 13A, 13B, 15A and 15B are assigned addresses. Each pair of second-level bit lines (13A and 13B) is assigned an odd address. Each pair of third-level bit lines (15A and 15B) is assigned an even address.

The detection of a failure which may occur in the second-level or third level interconnect patterns by the FBM will be described. For example, in the event of a short-circuit failure between second-level interconnect patterns, a column line 21 corresponding to an odd address is indicated as a defective bit in the FBM as shown in FIG. 9. On the other hand, in the event that a short circuit has occurred between third-level interconnect patterns, a column line 22 corresponding to an even address is indicated as a defective bit in the FBM. In the event of a short circuit between the fingers 15AA and 15BB, two column lines corresponding to consecutive even addresses are indicated as defective bit. Thus, a layer in which a failure has occurred can be identified by an address indication in the FMB, that is, based on whether the failure category indicated in the FMB is an odd or even address.

According to the third embodiment, as described above, each pair of interconnections supplied with different potentials is shaped into an interdigital form so that predetermined space is ensured between them, thereby allowing interconnect patterns to be formed so that minimum space portions are increased between them. This allows the rate of detecting a short circuit between each interconnection to be improved. Further, by forming interconnect patterns corresponding odd addresses from first-level patterns only and interconnect patterns corresponding to even addresses from second-level patterns only, it becomes possible to identify a layer in which a failure has occurred by failure indication by address in the FMB.

By improving the short-circuit sensing rate, a sign of failure can be detected in the SRAM-TEG 103X before failures occur in the products A, B and C shown in FIG. 5. On the basis of the result of the detection, the production line 101 for the products A, B an C is tuned up. Therefore, it becomes possible to avoid the occurrence of failures in the products A, B and C in advance.

Moreover, according to the third embodiment, a layer or region of the SRAM-TEG 103X in which a failure has occurred can be detected readily before failures occur in the products A, B and C shown in FIG. 5. The production line 101 for the products A, B and C is tuned up in accordance with the results of failure detection in the SRAM-TEG, thereby allowing the occurrences of failures in the products A, B and C to be avoided in advance.

The embodiments have been described in terms of bit lines. Since adjacent word lines are also supplied with different potentials, the present invention is also applicable to the word lines. The present invention is likewise applicable to any other interconnections provided that their adjacent ones are supplied with different potentials.

As described so far, the present invention can provide a semiconductor device which saves the necessity of physical analysis of defective regions and allows the time required for failure analysis to be reduced and the rate of failure detection to be improved.

Furthermore, according to the present invention, a method of manufacturing a semiconductor device using a failure-analyzing semiconductor device can be provided which allows failures which occur in semiconductor devices to be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A failure-analyzing semiconductor device configured to analyze failures on interconnections, comprising:
   a semiconductor substrate formed with memory cells for storing information;
   a first digitated interconnection formed above the semiconductor substrate and connected to the memory cells, the first digitated interconnection being shaped into a digitated form having fingers; and
   a second digitated interconnection formed above the semiconductor substrate and connected to the memory cells, the second digitated interconnection being shaped into a digitated form having fingers, the second digitated interconnection being formed at the same level as the first digitated interconnection with a predetermined space therebetween,
   wherein the fingers of the first digitated interconnection and those of the second digitated interconnection are arranged in engagement with each other.

2. The semiconductor device according to claim 1, wherein the first and second interconnections are bit lines supplied with signal potentials each of which is the inverse of the other.

3. The semiconductor device according to claim 1, wherein the first and second interconnections are adjacent word lines.

4. A failure-analyzing semiconductor device configured to analyze failures on interconnections, comprising:
   a semiconductor substrate formed with memory cells for storing information;
   a first interconnection formed above the semiconductor substrate and connected to the memory cells, the first interconnection being shaped into a digitated form having fingers;
   a second interconnection formed above the semiconductor substrate and connected to the memory cells, the second interconnection being shaped into a digitated form having fingers, the second interconnection being formed at the same level as the first interconnection with a predetermined space therebetween;
   a third interconnection formed above the first interconnection and connected to the memory cells, the third interconnection being shaped into a digitated form having fingers, the third interconnection being formed adjacent to the second interconnection; and a fourth interconnection formed at the same level as the third interconnection with a predetermined space therebetween and connected to the memory cells, the fourth interconnection being shaped into a digitated form having fingers, wherein the fingers of the first interconnection and those of the second interconnection are arranged in engagement with each other, and the fingers of the third interconnection and those of the fourth interconnection are arranged in engagement with each other.

5. The semiconductor device according to claim 4, wherein the memory cells are assigned addresses, and, when the memory cells connected to the first and second interconnections correspond to odd addresses, the memory cells connected to the third and fourth interconnections correspond to even addresses and vice versa.

6. The semiconductor device according to claim 4, wherein the first and second interconnections are bit lines supplied with signal potentials each of which is the inverse of the other and the third and fourth interconnections are bit lines supplied with signal potentials each of which is the inverse of the other.

7. The semiconductor device according to claim 4, wherein the first and second interconnections are adjacent word lines and the third and fourth interconnections are adjacent word lines.

8. A semiconductor device configured to analyze failures on interconnections, comprising:

a first semiconductor substrate formed with memory cells for storing information and adapted for a product; and a second semiconductor substrate formed with memory cells and adapted for failure analysis, the second semiconductor substrate having first and second digitated interconnections formed at the same level above the second semiconductor substrate and connected to the memory cells in the second semiconductor substrate, the first digitated interconnection being shaped into a digitated form having fingers and the second digitated interconnection being shaped into a digitated form having fingers, wherein the first and second digitated interconnections are arranged so that the fingers of each interconnection are interleaved with those of the other with a predetermined space therebetween, and the fingers of the first digitated interconnection and those of the second digitated interconnection are arranged in engagement with each other.

9. The semiconductor device according to claim 8, wherein the first and second interconnections are bit lines supplied with signal potentials each of which is the inverse of the other.

10. The semiconductor device according to claim 8, wherein the first and second interconnections are adjacent word lines.

11. A semiconductor device configured to analyze failures on interconnections, comprising:

a first semiconductor substrate formed with memory cells for storing information and adapted for a product; and a second semiconductor substrate formed with memory cells and adapted for failure analysis, the second semiconductor substrate having, a first interconnection formed above the second semiconductor substrate and connected to the memory cells, the first interconnection being shaped into a digitated form having fingers, a second interconnection formed at the same level as the first interconnection with a predetermined space therebetween and connected to the memory cells, the second interconnection being shaped into a digitated form having fingers, a third interconnection formed above the first interconnection and connected to the memory cells, the third interconnection being shaped into a digitated form having fingers, the third interconnection being formed adjacent to the second interconnection, and a fourth interconnection formed at the same level as the third interconnection with a predetermined space therebetween and connected to the memory cells, the fourth interconnection being shaped into a digitated form having fingers, wherein the fingers of the first interconnection and those of the second interconnection are arranged in engagement with each other, and the fingers of the third interconnection and those of the fourth interconnection are arranged in engagement with each other.

12. The semiconductor device according to claim 11, wherein the memory cells are assigned addresses, and, when the memory cells connected to the first and second interconnections correspond to odd addresses, the memory cells connected to the third and fourth interconnections correspond to even addresses and vice versa.

13. The semiconductor device according to claim 11, wherein the first and second interconnections are bit lines supplied with signal potentials each of which is the inverse of the other and the third and fourth interconnections are bit lines supplied with signal potentials each of which is the inverse of the other.

14. The semiconductor device according to claim 11, wherein the first and second interconnections are adjacent word lines and the third and fourth interconnections are adjacent word lines.

* * * * *